US006780546B2

(12) United States Patent
Trentler et al.

(10) Patent No.: US 6,780,546 B2
(45) Date of Patent: Aug. 24, 2004

(54) BLUE-SENSITIZED HOLOGRAPHIC MEDIA

(75) Inventors: Timothy J. Trentler, Longmont, CO (US); Melinda Schnoes, Longmont, CO (US)

(73) Assignee: InPhase Technologies, Inc., Longmont, CO (US)

( * ) Notice: Subject to any disclaimer, the term of this patent is extended or adjusted under 35 U.S.C. 154(b) by 0 days.

(21) Appl. No.: 10/166,172

(22) Filed: Jun. 11, 2002

(65) Prior Publication Data

US 2003/0083395 A1 May 1, 2003

Related U.S. Application Data

(60) Provisional application No. 60/315,713, filed on Aug. 30, 2001.

(51) Int. Cl.[7] .................................................. G03H 1/02
(52) U.S. Cl. ............................. 430/1; 430/2; 430/290; 359/3; 522/38
(58) Field of Search ........................... 430/1, 2, 290; 359/3; 522/38

(56) References Cited

U.S. PATENT DOCUMENTS

| | | | |
|---|---|---|---|
| 3,658,526 A | 4/1972 | Haugh | 430/1 |
| 4,139,388 A | 2/1979 | Reich et al. | 430/1 |
| 4,792,632 A | * 12/1988 | Ellrich et al. | 430/910 |
| 5,547,786 A | 8/1996 | Brandstetter et al. | 430/1 |
| 5,642,209 A | 6/1997 | Baker | 430/5 |
| 5,725,970 A | * 3/1998 | Martin et al. | 430/2 |
| 5,744,219 A | * 4/1998 | Tahara | 428/195 |
| 5,858,614 A | 1/1999 | Sato et al. | 430/1 |
| 5,869,210 A | 2/1999 | Ohkuma et al. | 430/2 |
| 5,891,931 A | 4/1999 | Leboeuf et al. | 522/29 |
| 5,942,290 A | 8/1999 | Leppard et al. | 522/38 |
| 6,080,450 A | 6/2000 | Cantor | |
| 6,103,454 A | 8/2000 | Dhar et al. | 430/2 |
| 6,115,151 A | 9/2000 | Popovich | 430/1 |
| 6,127,066 A | 10/2000 | Ueda et al. | 430/1 |
| 6,154,432 A | 11/2000 | Faruqi et al. | 369/103 |
| 2003/0044690 A1 | * 3/2003 | Rotto | 430/1 |
| 2003/0044691 A1 | * 3/2003 | Settachaynon et al. | 430/1 |

FOREIGN PATENT DOCUMENTS

| | | |
|---|---|---|
| EP | 0 945 762 | 9/1999 |
| EP | 1 026 546 | 8/2000 |
| GB | 2310855 | * 9/1997 |

OTHER PUBLICATIONS

Weast, R.C., et al., ed, "CRC Handbook of Chemistry and Physics", 63rd Ed., p. E–201 (1983).*
PCT Search Report. (PCT/US02/27355) Feb. 12, 2003.

* cited by examiner

Primary Examiner—Martin Angebranndt
(74) Attorney, Agent, or Firm—Morrison & Foerster LLP

(57) ABSTRACT

Blue-sensitized holographic media suitable for recording with a blue laser is disclosed. The blue-sensitized holographic media provides greater dynamic range and a higher sensitivity than a green-sensitized holographic media, thereby providing more rapid hologram writing times.

29 Claims, 1 Drawing Sheet

BLUE-SENSITIZED HOLOGRAPHIC MEDIA

RELATED APPLICATION

This application claims priority from U.S. Provisional Application No. 60/315,713, filed Aug. 30, 2001, which is entitled the same as this application.

FIELD OF THE INVENTION

This invention relates to a blue light sensitive holographic recording article that could be used either with holographic storage systems or as components such as optical filters or beam steerers. In particular, the invention relates to the photosensitization of high performance holographic recording media to blue laser wavelengths.

BACKGROUND

Developers of information storage devices and methods continue to seek increased storage capacity. As part of this development, so-called page-wise memory systems, in particular, a holographic system, have been suggested as alternatives to conventional memory devices.

A hologram stores data in three dimensions and reads an entire page of data at one time, i.e., page-wise, which is unlike an optical CD disk that stores data in two dimensions and reads a track at a time. Page-wise systems involve the storage and readout of an entire two-dimensional representation, e.g., a page, of data. Typically, recording light passes through a two-dimensional array of dark and transparent areas representing data, and the holographic system stores, in three dimensions, holographic representations of the pages as patterns of varying refractive index imprinted into a storage medium. Holographic systems are discussed generally in D. Psaltis et al., "Holographic Memories," *Scientific American*, November 1995, the disclosure of which is hereby incorporated by reference. One method of holographic storage is phase correlation multiplex holography, which is described in U.S. Pat. No. 5,719,691 issued Feb. 17, 1998, the disclosure of which is hereby incorporated by reference.

The advantages of recording a hologram are high density (storage of hundreds of billions of bytes of data), high speed (transfer rate of a billion or more bits per second) and ability to select a randomly chosen data element in 100 microseconds or less. These advantages arise from three-dimensional recording and from simultaneous readout of an entire page of data at one time.

A hologram is a pattern, also known as a grating, which is formed when two laser beams interfere with each other in a light-sensitive material (LSM) whose optical properties are altered by the intersecting beams. One choice of a LSM is a photosensitive polymer film. See, e.g., W. K. Smothers et al., "Photopolymers for Holography," SPIE OE/Laser Conference, 1212–03, Los Angeles, Calif., 1990. The material described in this article contains a photoimageable system containing a liquid monomer material (a photoactive monomer) and a photoinitiator (which promotes the polymerization of the monomer upon exposure to light), where the photoimageable system is in an organic polymer host matrix that is substantially inert to the exposure light. During writing of information into the material (by passing recording light through an array representing data), the monomer polymerizes in the exposed regions.

U.S. Pat. No. 6,103,454 and application Ser. No. 09/046,822, the disclosures of which are hereby incorporated by reference, also relate to a photoimageable system in an organic polymer matrix. In particular, the application discloses a recording medium formed by polymerizing matrix material in situ from a fluid mixture of organic oligomer matrix precursor and a photoimageable system.

The conventional photoimageable systems have generally been optimized for sensitization with green laser light having a wavelength of 532 nm. However, holographic recording using green laser is inherently limited by its wavelength. In general, a denser data-storage is possible using a shorter wavelength laser. Blue wavelength lasers have wavelengths of 400–490 nm (particularly 405 nm). Therefore, a photoimageable system for holographic recording that could be used with a blue laser is desired.

SUMMARY OF THE INVENTION

This invention in high performance holographic recording articles is based on novel holographic formulations that can be used with blue lasers, which provide several advantages to the holographic performance of these media. First, a denser data-storage is achieved due to the shorter wavelength of blue light as compared to a green light. Second, a higher dynamic range (M/#) is achieved in a given matrix/photopolymer formulation owing to a somewhat higher refractive index contrast inherent to the media components in the blue portion of the electromagnetic spectrum compared to the green portion. Third, the sensitivity of the blue sensitized media is higher as compared to the green sensitized media, hence affording more rapid hologram writing times.

In addition to these advantages, the blue sensitized media uses an entirely organic photosensitizer. The green photosensitized media, on the other hand, owe their sensitivity to a transition metal complex photosensitizer that is reduced during hologram recording. This reduced complex absorbs visible light, coloring the media, due to excitation of a d orbital electron to a d* state. Because this absorption interferes with the process of writing and reading holographic data, an oxidizing agent (e.g., tert-butyl hydroperoxide) is typically added to the green media to increase the oxidation state of the metal center by removing the d electron and its associated transition. In contrast, the blue sensitized media does not contain such a transition metal complex and therefore bleaches to completely transparent state at all visible wavelengths without any oxidizing or other additives. It is also noted that oxidizing agents tend to adversely impact thermal stability of the media and/or media components.

While affording these advantages, blue sensitization affords no apparent disadvantages to the optical quality of these media compared to green sensitization. For example, shrinkage levels are the same for sensitization with either color. Also, hologram quality, as exemplified by a close experimental match to Kogelnik's coupled wave theory for volume holography, remains high.

Additional advantages of this invention would become readily apparent to those skilled in this art from the following detailed description, wherein only the preferred embodiments of this invention are shown and described, simply by way of illustration of the best mode contemplated for carrying out this invention. As would be realized, this invention is capable of other and different embodiments and its details are capable of modifications in various obvious respects, all without departing from this invention. Accordingly, the drawings and description are to be regarded as illustrative in nature and not as restrictive.

DETAILED DESCRIPTION OF THE INVENTION

Figure 1:
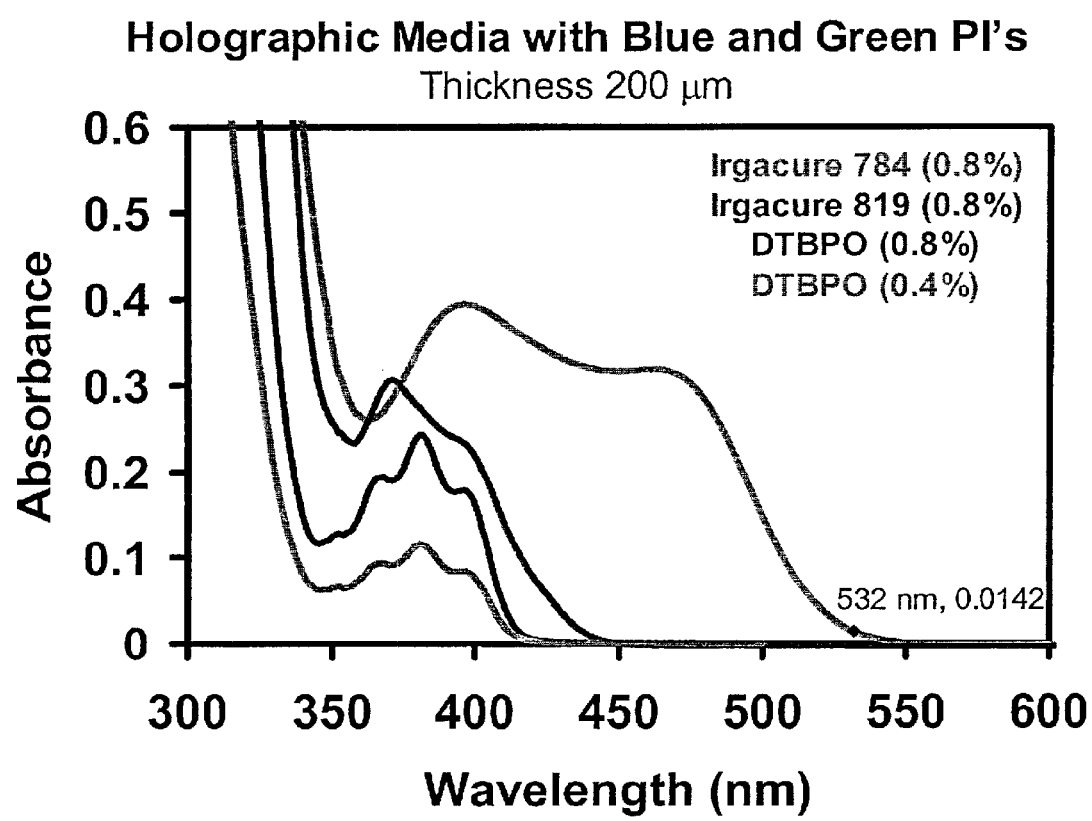
FIG. 1 shows an UV-visible absorption spectra of holographic media.

FIG. 1 illustrates the reduced absorption for comparable photoinitiator concentrations of blue-sensitized media relative to green-sensitized media at blue wavelengths (400–500 nm). The green-sensitized media is tuned for use with a 532-nm laser, but for thick (up to 1.5 mm) samples, the optical density would be too high for use with blue lasers. Photoinitiators such as Irgacure® 819 and DTBPO, however, are preferred for sensitizing the media to blue wavelengths of 405 to 450 nm.

The optical article, e.g., holographic recording medium, of the invention is formed by steps including mixing a matrix precursor and a photoactive monomer, and curing the mixture to form the matrix in situ. The matrix precursor and photoactive monomer are selected such that (a) the reaction by which the matrix precursor is polymerized during the cure is independent from the reaction by which the photoactive monomer will be polymerized during writing of a pattern, e.g., data, and (b) the matrix polymer and the polymer resulting from polymerization of the photoactive monomer (the photopolymer) are compatible with each other. As discussed previously, the matrix is considered to be formed when the photorecording material, i.e., the matrix material plus the photoactive monomer, photoinitiator, and/or other additives, exhibits an elastic modulus of at least about $10^5$ Pa, generally about $10^5$ Pa to about $10^9$ Pa, advantageously about $10^6$ Pa to about $10^8$ Pa.

The compatibility of the matrix polymer and photopolymer tends to prevent large-scale (>100 nm) phase separation of the components, such large-scale phase separation typically leading to undesirable haziness or opacity. Utilization of a photoactive monomer and a matrix precursor that polymerize by independent reactions provides a cured matrix substantially free of cross-reaction, i.e., the photoactive monomer remains substantially inert during the matrix cure. In addition, due to the independent reactions, there is no inhibition of subsequent polymerization of the photoactive monomer. The resulting optical article is capable of exhibiting desirable refractive index contrast due to the independence of the matrix from the photoactive monomer.

The formation of a hologram, waveguide, or other optical article relies on a refractive index contrast ($\Delta n$) between exposed and unexposed regions of a medium, this contrast is at least partly due to monomer diffusion to exposed regions. High index contrast is desired because it provides improved signal strength when reading a hologram, and provides efficient confinement of an optical wave in a waveguide. One way to provide high index contrast in the invention is to use a photoactive monomer having moieties (referred to as index-contrasting moieties) that are substantially absent from the matrix, and that exhibit a refractive index substantially different from the index exhibited by the bulk of the matrix. For example, high contrast would be obtained by using a matrix that contains primarily aliphatic or saturated alicyclic moieties with a low concentration of heavy atoms and conjugated double bonds (providing low index) and a photoactive monomer made up primarily of aromatic or similar high-index moieties.

The matrix is a solid polymer formed in situ from a matrix precursor by a curing step (curing indicating a step of inducing reaction of the precursor to form the polymeric matrix). It is possible for the precursor to be one or more monomers, one or more oligomers, or a mixture of monomer and oligomer. In addition, it is possible for there to be greater than one type of precursor functional group, either on a single precursor molecule or in a group of precursor molecules. (Precursor functional groups are the group or groups on a precursor molecule that are the reaction sites for polymerization during matrix cure.) To promote mixing with the photoactive monomer, the precursor is advantageously liquid at some temperature between about –50° C. and about 80° C. Advantageously, the matrix polymerization is capable of being performed at room temperature. Also advantageously, the polymerization is capable of being performed in a time period of less than 5 minutes. The glass transition temperature ($T_g$) of the photorecording material is advantageously low enough to permit sufficient diffusion and chemical reaction of the photoactive monomer during a holographic recording process. Generally, the $T_g$ is not more than 50° C. above the temperature at which holographic recording is performed, which, for typical holographic recording, means a $T_g$ between about 80° C. and about –130° C. (as measured by conventional methods).

Examples of polymerization reactions contemplated for forming matrix polymers in the invention include cationic epoxy polymerization, cationic vinyl ether polymerization, cationic alkenyl ether polymerization, cationic allene ether polymerization, cationic ketene acetal polymerization, epoxy-amine step polymerization, epoxy-mercaptan step polymerization, unsaturated ester-amine step polymerization (via Michael addition), unsaturated ester-mercaptan step polymerization (via Michael addition), vinyl-silicon hydride step polymerization (hydrosilylation), isocyanate-hydroxyl step polymerization (urethane formation), and isocyanatae-amine step polymerization (urea formation).

Several such reactions are enabled or accelerated by suitable catalysts. For example, cationic epoxy polymerization takes place rapidly at room temperature by use of $BF_3$-based catalysts (or other Lewis acids), other cationic polymerization's proceed in the presence of protons, epoxy-mercaptan reactions and Michael additions are accelerated by bases such as amines, hydrosilylation proceeds rapidly in the presence of transition metal catalysts such as platinum, and urethane and urea formation proceed rapidly when tin catalysts are employed. It is also possible to use photogenerated catalysts for matrix formation, provided that steps are taken to prevent polymerization of the photoactive monomer during the photogeneration.

Formulation of a version of high performance holographic recording systems comprises the following ingredients:

| | |
|---|---|
| NCO-terminated prepolymers | 20–50 Wt % |
| Acrylate Monomers | 1–50 Wt % |
| Photoinitiators | 0.01–3 Wt % |
| Polyols | 40–75 Wt % |
| Catalysts | 0–3 Wt % |
| Thermal inhibitors and other additives | 0–1 Wt % |

The NCO-terminated prepolymers are selected from the by-products of diols and diisocyanates that have wt % contents of NCO in the range of 10 to 25. The NCO contents were determined based on the prepolymer, unreacted diisocyanate and optionally added neat polyisocyanate to achieve the high performance characteristics. Aliphatic diisocyanate-based prepolymers are preferred. Despite affording quicker matrix polymerization, aromatic isocyanates are less preferred because they afford lower index contrast.

When the NCO-terminated prepolymer is based on aliphatic diisocyanates, 5 to 100% of its wt % contents of NCO have to be derived from aromatic diisocyanates or aliphatic polyisocyanates. Preferred aromatic diisocyanates are, but not limited to, diphenylmethane diisocyanate (MDI) and toluene diisocyanate (TDI). Preferred aliphatic polyisocyanates are: Hexamethylene diisocyanate (HDI) and its biuret, isocyanurate, methylenebiscyclohexylisocyanate, and other derivatives.

A photoactive material could be any material, preferably a monomer, capable of undergoing a reaction, preferably photoinitiated polymerization, by exposure to light. Furthermore, if the photoactive material is a monomer, then the monomer, in combination with matrix materials, meets the polymerization reaction and compatibility requirements of the invention.

Suitable photoactive monomers include those that polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. A free-radical copolymerizable pair system such as vinyl ether mixed with maleate and thiol mixed with olefin is also suitable. It is also possible to use cationically polymerizable systems such as vinyl ethers, alkenyl ethers, allene ethers, ketene acetals, and epoxies. It is also possible for a single photoactive monomer molecule to contain more than one monomer functional group. As mentioned previously, relatively high index contrast is desired in the article of the invention, whether for improved readout in a recording media or efficient light confinement in a waveguide. In addition, it is generally advantageous to induce this relatively large index change with a small number of monomer functional groups, because polymerization of the monomer usually induces shrinkage in a material. However, in the case of expanding monomers, larger numbers of monomer functional groups can be implemented.

Such shrinkage has a detrimental effect on the retrieval of data from stored holograms, and also degrades the performance of waveguide devices such as by increased transmission losses or other performance deviations. Lowering the number of monomer functional groups that must be polymerized to attain the necessary index contrast is therefore desirable. This lowering is possible by increasing the ratio of the molecular volume of the monomers to the number of monomer functional groups on the monomers. This increase is attainable by incorporating into a monomer larger index-contrasting moieties and/or a larger number of index-contrasting moieties. For example, if the matrix is composed primarily of aliphatic or other low index moieties and the monomer is a higher index species where the higher index is imparted by a benzene ring, the molecular volume could be increased relative to the number of monomer functional groups by incorporating a naphthalene ring instead of a benzene ring (the naphthalene having a larger volume), or by incorporating one or more additional benzene rings, without increasing the number of monomer functional groups. In this manner, polymerization of a given volume fraction of the monomers with the larger molecular volume/monomer functional group ratio would require polymerization of less monomer functional groups, thereby inducing less shrinkage. But the requisite volume fraction of monomer would still diffuse from the unexposed region to the exposed region, thus providing the desired refractive index.

The molecular volume of the monomer, however, should not be so large as to slow diffusion below an acceptable rate. Diffusion rates are controlled by factors including size of diffusing species, viscosity of the medium, and intermolecular interactions. Larger species tend to diffuse more slowly, but it would be possible in some situations to lower the viscosity or make adjustments to the other molecules present in order to raise diffusion to an acceptable level. Also, in accord with the discussion herein, it is important to ensure that larger molecules maintain compatibility with the matrix.

Numerous architectures are possible for monomers containing multiple index-contrasting moieties. For example, it is possible for the moieties to be in the main chain of a linear oligomer, or to be substituents along an oligomer chain. Alternatively, it is possible for the index-contrasting moieties to be the subunits of a branched or dendritic low molecular weight polymer.

The preferred acrylate monomers are monofunctional. These include 2,4,6-tribromophenylacrylate, pentabromoacrylate, isobornylacrylate, phenylthioethyl acrylate tetrahydrofurfurylacrylate, 1-vinyl-2-pyrrolidinone, asymmetric bis thionapthyl acrylate, 2-phenoxyethylacrylate, and the like.

In addition to the photoactive monomer, the optical article typically contains a photoinitiator (the photoinitiator and photoactive monomer being part of the overall photoimageable system). The photoinitiator, upon exposure to relatively low levels of the recording light, chemically initiates the polymerization of the monomer, avoiding the need for direct light-induced polymerization of the monomer. The photoinitiator generally should offer a source of species that initiate polymerization of the particular photoactive monomer. Typically, 0.01 to 20 wt. % photoinitiator, based on the weight of the photoimageable system, provides desirable results.

A variety of photoinitiators known to those skilled in the art and available commercially are suitable for use in the invention. It is advantageous to use a photoinitiator that is sensitive at wavelengths available from laser sources. For example, photoinitiator of choice for green laser is bis($\eta$-5-2,4-cyclopentadien-1-yl)bis[2,6-difluoro-3-(1H-pyrrol-1-yl) phenyl]titanium, available commercially from Ciba as Irgacure® 784.

The photoinitiating systems of this invention are comprised of UV initiators from Ciba Specialty Chemicals (CSC) that have peak absorption maxima at UV wavelengths and absorption tails that stretch into the blue region of the electromagnetic spectrum between 400 and 500 nm. These include Darocur® 4265, Irgacure® 9 369, Irgacure® 1800, Irgacure® 2020, and Irgacure® 819, with the last being preferred. Such photoinitiator systems are used because of the requirements that the holographic media be thick (up to 1.5 mm) while the optical density of the media is kept low at blue writing wavelengths (400–500 nm), i.e., optical density (absorbance) <1. In a thick material, strongly absorbing photoinitiators (such as photoinitiator systems having peak absorbance in the blue region of the electromagnetic spectrum) would impart high optical density (>1) to the media at blue wavelengths if incorporated into the media at concentrations adequate to complete photopolymerization of the monomers, i.e. >90% monomers polymerized. Optical density >1 is undesirable because this implies greatly diminishing light penetration due to absorbance across the thickness of the media during hologram recording. Photoinitiator molecules on the backside of the media, then, see less or no light (fewer photons) during hologram recording. Fewer monomers are therefore polymerized and holographic grating strength consequently diminishes across the thickness of the media in accord with this diminution in penetrating photons. Effectively, then, when optical density is too high, holograms are recorded that do not use the entire thickness of the media. This has deleterious implications in terms of angular bandwidth, hologram strength, and media capacity. When using the photoinitiator systems described herein that have peak absorption outside the blue region of the electromagnetic spectrum, higher and adequate concentration can be implemented to allow completed photopolymerization while yet avoiding these absorbance related deleterious effects.

Some of the photoinitiators available from CSC that could be used in this invention have the following properties.

Irgacure® 819 is a phosphine oxide photoinitiator in which the absorption is strong from 440 nm (visible blue) and lower in the UV spectrum.

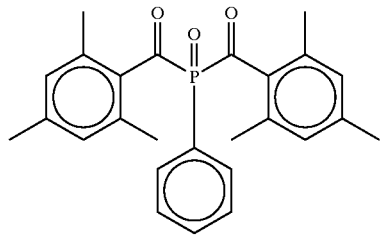

Irgacure 819

Irgacure® 819XF is a finely ground version of Irgacure® 819 which dissolves much more rapidly in common acrylate monomers.

Irgacure® 2020 is a liquid phosphine oxide containing photoinitiator.

Irgacure® 1300 is a fast dissolving alpha-hydroxy ketone based photo initiator with improved solubility as compared to Irgacure® 369.

Irgacure® 184 is a non-yellowing solid photoinitiator useful as a co-initiator in many formulations.

Darocur® 1173 is a non-yellowing liquid photoinitiator with low viscosity. Good solvency properties make it useful in blends with other photoinitiators.

Irgacure® 500 is a liquid blend of benzophenone and Irgacure® 184. Due to the inclusion of benzophenone in this eutectic mixture, the formulation should contain an extractable hydrogen-donating component to achieve optimal performance.

Irgacure® 651 is a general-purpose solid UV photoinitiator useful in formulations containing styrene and where post yellowing is not a concern.

Darocur® 4265 is a liquid photoinitiator comprising a blend of Darocur® 1173 and Lucirin® TPO. Lucirin® TPO is a product of BASF.

Irgacure® 2959 is a very low odor and low volatility photoinitiator. It contains a terminal OH group, which may provide a site for additional reactions.

Other photoinitiators from CSC include Irgacure® 369, Irgacure®O 1800 and Irgacure® 1700.

The above photo initiators could be used alone or in combination with another initiator.

Also, diphenyl(2,4,6-trimethylbenzoyl)phosphine oxide (DTBPO), which is not from CSC but can be obtained from Aldrich could be used as a photoinitiator. This is a phosphine oxide similar to Irgacure® 819, but having lower absorbance in the blue region of the spectrum. The formula of DTBPO is the following:

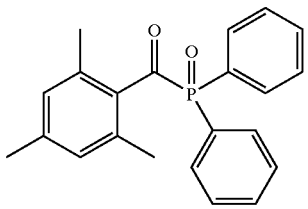

In one embodiment, the matrix is a polymer formed by mercaptan-epoxy step polymerization, more advantageously a polymer formed by mercaptan-epoxy step polymerization having a polyether backbone. The polyether backbone offers desirable compatibility with several useful photoactive monomers, particularly vinyl aromatic compounds. Specifically, photoactive monomers selected from styrene, bromostyrene, divinyl benzene, and 4-methylthio-1-vinylnaphthalene (MTVN) have been found to be useful with matrix polymers formed by mercaptan-epoxy step polymerization and having a polyether backbone. A monomer that has more than one index-contrasting moiety and that is also useful with these polyether matrix polymers is 1-(3-(naphth-1-ylthio)propylthio)-4-vinylnaphthalene.

To be independent, the polymerization reactions for the matrix precursor and the photoactive monomer are selected such that: (a) the reactions proceed by different types of reaction intermediates, (b) neither the intermediate nor the conditions by which the matrix is polymerized will induce substantial polymerization of the photoactive monomer functional groups, and (c) neither the intermediate nor the conditions by which the matrix is polymerized will induce a non-polymerization reaction of the monomer functional groups that causes cross-reaction (between the monomer functional groups and the matrix polymer) or inhibits later polymerization of the monomer functional groups. According to item (a), if a matrix is polymerized by use of an ionic intermediate, it would be suitable to polymerize the photoactive monomer by use of a free radical reaction. In accordance with item (b), however, the ionic intermediate should not induce substantial polymerization of the photoactive monomer functional groups. Also in accordance with item (b), for example, one must be aware that a photoinitiated free radical matrix polymerization will typically induce a photoinitiated cationic polymerization of a photoactive monomer functional group. Thus, two otherwise independent reactions are not independent for purposes of the invention if both are driven by a single reaction condition. In accordance with item (c), for example, base-catalyzed matrix polymerization should not be performed when the photoactive monomer functional group undergoes a non-polymerization reaction in response to the base, even if polymerization of the monomer functional group is performed by an independent reaction. A specific example is that a base-catalyzed epoxy-mercaptan polymerization should not be used with an acrylate monomer because, although the acrylate is polymerized by a free radical reaction, the acrylate will react with the mercaptans under base catalysis, resulting in a cross-reaction.

Table 1 below illustrates some examples of matrix/photoactive monomer combinations where the matrix polymerization reaction and photoactive monomer polymerization are capable of being independent, and examples where the polymerization interfere with each other. (Photoactive monomers are horizontal, and matrix polymers are vertical. "X" indicates cross-reaction or monomer polymerization during matrix polymerization. "O" indicates independent reactions. "I" indicates that the photoactive monomer polymerization is inhibited by the reagents or reaction that form the polymeric matrix, e.g., the photoactive monomer functional group is converted to a non-polymerizing group, or chemical species are present after the matrix cure that substantially slow the rate or yield of polymerization of the monomer functional groups.)

TABLE 1

|  | (Meth) acrylates | Styrene Derivatives | Vinyl Ethers | Epoxies |
|---|---|---|---|---|
| Cationic Epoxy | O | O | X | X |
| Cationic Vinyl Ethers | O | O | X | X |
| Epoxy (amine) | X | O | I | X |
| Epoxy (mercaptan) | X | O | I | X |
| Unsaturated ester (amine) | X | O | I | X |
| Unsaturated ester (mercaptan) | X | O | I | X |
| Hydrosilylation | X | X | X | O |
| Urethane formation | O | O | O | X |

For purposes of the invention, polymers are considered to be compatible if a blend of the polymers is characterized, in 90° light scattering, by a Rayleigh ratio ($R_{90°}$) less than $7 \times 10^{-3}$ cm$^{-1}$. The Rayleigh ratio, $R_\theta$, is a conventionally known property, and is defined as the energy scattered by a unit volume in the direction $\theta$, per steradian, when a medium is illuminated with a unit intensity of unpolarized light, as discussed in M. Kerker, *The Scattering of Light and Other Electromagnetic Radiation*, Academic Press, San Diego, 1969. The light source used for the measurement is generally a laser having a wavelength in the visible part of the spectrum. Normally, the wavelength intended for use in writing holograms is used. The scattering measurements are made upon a photorecording material that has been flood exposed. The scattered light is collected at an angle of 90° from the incident light, typically by a photodetector. It is possible to place a narrowband filter, centered at the laser wavelength, in front of such a photodetector to block fluorescent light, although such a step is not required. The Rayleigh ratio is typically obtained by comparison to the energy scatter of a reference material having a known Rayleigh ratio.

Polymer blends that are considered to be miscible, e.g., according to conventional tests such as exhibition of a single glass transition temperature, will typically be compatible as well, i.e., miscibility is a subset of compatibility. Standard miscibility guidelines and tables are therefrom useful in selecting a compatible blend. However, it is possible for polymer blends that are immiscible to be compatible according to the light scattering test above.

A polymer blend is generally considered to be miscible if the blend exhibits a single glass transition temperature, $T_g$, as measured by conventional methods. An immiscible blend will typically exhibit two glass transition temperatures corresponding to the $T_g$ values of the individual polymers. $T_g$ testing is most commonly performed by differential scanning calorimetry (DSC), which shows the $T_g$ as a step change in the heat flow (typically the ordinate). The reported $T_g$ is typically the temperature at which the ordinate reaches the mid-point between extrapolated baselines before and after the transition. It is also possible to use Dynamic Mechanical Analysis (DMA) to measure $T_g$. DMA measures the storage modulus of a material, which drops several orders of magnitude in the glass transition region. It is possible in certain cases for the polymers of a blend to have individual $T_g$ values that are close to each other. In such cases, conventional methods for resolving such overlapping $T_g$ should be used, such as discussed in Brinke et al., "The thermal characterization of multi-component systems by enthalpy relaxation," *Thermochimica Acta*, 238 (1994), at 75.

Matrix polymer and photopolymer that exhibit miscibility are capable of being selected in several ways. For example, several published compilations of miscible polymers are available, such as O. Olabisi et al, *Polymer-Polymer Miscibility*, Academic Press, New York, 1979; L. M. Robeson, *MMI, Press Symp. Ser.*, 2, 177, 1982; L. A. Utracki, *Polymer Alloys and Blends: Thermodynamics and Rheology*, Hanser Publishers, Munich, 1989; and S. Krause in *Polymer Handbook*, J. Brandrup and E. H. Immergut, Eds., 3rd Ed., Wiley Interscience, New York, 1989, pp. VI 347–370, the disclosures of which are hereby incorporated by reference. Even if a particular polymer of interest is not found in such references, the approach specified allows determination of a compatible photorecording material by employing a control sample.

Determination of miscible or compatible blends is further aided by intermolecular interaction considerations that typically drive miscibility. For example, it is well known that polystyrene and poly(methylvinylether) are miscible because of an attractive interaction between the methyl ether group and the phenyl ring. It is therefore possible to promote miscibility, or at least compatibility, of two polymers by using a methyl ether group in one polymer and a phenyl group in the other polymer. It has also been demonstrated that immiscible polymers are capable of being made miscible by the incorporation of appropriate functional groups that can provide ionic interactions. (See Z. L. Zhou and A. Eisenberg, *J. Polym. Sci., Polym. Phys. Ed.*, 21 (4), 595, 1983; R. Murali and A. Eisenberg, *J. Polym. Sci., Part B: Polym. Phys.*, 26 (7), 1385, 1988; and A Natansohn et al., *Makromol. Chem., Macromol. Symp.*, 16, 175, 1988). For example polyisoprene and polystyrene are immiscible. However, when polyisoprene is partially sulfonated (5%), and 4-vinyl pyridine is copolymerized with the polystyrene, the blend of these two functionalized polymers is miscible. It is contemplated that the ionic interaction between the sulfonated groups and the pyridine group (proton transfer) is the driving force that makes this blend miscible. Similarly, polystyrene and poly(ethyl acrylate), which are normally immiscible, have been made miscible by lightly sulfonating the polystyrene. (See R. E. Taylor-Smith and R. A. Register, *Macromolecules*, 26, 2802, 1993.) Charge-transfer has also been used to make miscible polymers that are otherwise immiscible. For example it has been demonstrated that, although poly(methyl acrylate) and poly(methyl methacrylate) are immiscible, blends in which the former is copolymerized with (N-ethylcarbazol-3-yl)methyl acrylate (electron donor) and the latter is copolymerized with 2-[(3, 5-dinitrobenzoyl)oxy]ethyl methacrylate (an electron acceptor) are miscible, provided the right amounts of donor and acceptor are used. (See M. C. Piton and A. Natansohn, *Macromolecules*, 28, 15, 1995.) Poly(methyl methacrylate) and polystyrene are also capable of being made miscible using the corresponding donor-acceptor co-monomers (See M. C. Piton and A. Natansohn, *Macromolecules*, 28, 1605, 1995).

A variety of test methods exist for evaluating the miscibility or compatibility of polymers, as reflected in the recent overview published in A. Hale and H. Bair, Ch. 4-"Polymer Blends and Block Copolymers," *Thermal Characterization* of Polymeric Materials, 2nd Ed., Academic Press, 1997. For example, in the realm of optical methods, opacity typically indicates a two-phase material, whereas clarity generally indicates a compatible system. Other methods for evaluating miscibility include neutron scattering, infrared spectroscopy (IR), nuclear magnetic resonance (NMR), x-ray scattering and diffraction, fluorescence, Brillouin scattering, melt titration, calorimetry, and chemilluminescence. See, for example, L. Robeson, supra; S. Krause, *Chemtracts—Macromol. Chem.*, 2, 367, 1991a; D. Vessely in *Polymer Blends and Alloys*, M. J. Folkes and P. S. Hope, Eds., Blackie Academic and Professional, Glasgow, pp. 103–125; M. M. Coleman et al. *Specific Interactions and the Miscibility of Polymer Blends*, Technomic Publishing, Lancaster, Pa., 1991; A. Garton, *Infrared Spectroscopy of Polymer Blends, Composites and Surfaces*, Hanser, New York, 1992; L. W. Kelts et al., *Macromolecules*, 26, 2941, 1993; and J. L. White and P. A. Mirau, *Macromolecules*, 26, 3049, 1993; J. L. White and P. A. Mirau, *Macromolecules*, 27, 1648, 1994; and C. A. Cruz et al., *Macromolecules*, 12, 726, 1979; and C. J. Landry et al., *Macromolecules*, 26, 35, 1993.

Compatibility has also been promoted in otherwise incompatible polymers by incorporating reactive groups into the polymer matrix, where such groups are capable of reacting with the photoactive monomer during the holographic recording step. Some of the photoactive monomer will thereby be grafted onto the matrix during recording. If there are enough of these grafts, it is possible to prevent or reduce phase separation during recording. However, if the refractive index of the grafted moiety and of the monomer are relatively similar, too many grafts, e.g., more than 30% of monomers grafted to the matrix, will tend to undesirably reduce refractive index contrast.

A holographic recording medium of the invention is formed by adequately supporting the photorecording material, such that holographic writing and reading is possible. Typically, fabrication of the medium involves depositing the matrix precursor/photoimageable system mixture between two plates. The plates are typically glass, but it is also possible to use other materials transparent to the radiation used to write data, e.g., a plastic such as polycarbonate or poly(methyl methacrylate). It is possible to use spacers between the plates to maintain a desired thickness for the recording medium. During the matrix cure, it is possible for shrinkage in the material to create stress in the plates, such stress altering the parallelism and/or spacing of the plates and thereby detrimentally affecting the medium's optical properties. To reduce such effects, it is useful to place the plates in an apparatus containing-mounts, e.g., vacuum chucks, capable of being adjusted in response to changes in parallelism and/or spacing. In such an apparatus, it is possible to monitor the parallelism in real-time by use of a conventional interferometric method, and make any necessary adjustments during the cure. Such a method is discussed, for example, in U.S. patent application Ser. No. 08/867,563, U.S. Pat. No. 5,932,045 the disclosure of which are hereby incorporated by reference. The photorecording material of the invention is also capable of being supported in other ways. For instance, it is conceivable to dispose the matrix precursor/photoimageable system mixture into the pores of a substrate, e.g., a nanoporous glass material such as Vycor, prior to matrix cure. More conventional polymer processing is also envisioned, e.g., closed mold formation or sheet extrusion. A stratified medium is also contemplated, i.e., a medium containing multiple substrates, e.g., glass, with layers of photorecording material disposed between the substrates.

The medium of the invention is then capable of being used in a holographic system such as discussed previously. The amount of information capable of being stored in a holographic medium is proportional to the product of: the refractive index contrast, $\Delta n$, of the photorecording material, and the thickness, d, of the photorecording material. The refractive index contrast, $\Delta n$, is conventionally known, and is defined as the amplitude of the sinusoidal variations in the refractive index of a material in which a plane-wave, volume hologram has been written. The refractive index varies as: $n(x)=n_0+\Delta n \cos(K_x)$, where $n(x)$ is the spatially varying refractive index, x is the position vector, K is the grating wavevector, and $n_0$ is the baseline refractive index of the medium. See, e.g., P. Hariharan, *Optical Holography: Principles, Techniques, and Applications*, Cambridge University Press, Cambridge, 1991, at 44.) The $\Delta n$ of a material is typically calculated from the diffraction efficiency or efficiencies of a single volume hologram or a multiplexed set of volume holograms recorded in a medium. The $\Delta n$ is associated with a medium before writing, but is observed by measurement performed after recording.

Examples of other optical articles include beam filters, beam steerers or deflectors, and optical couplers. (See, e.g., L. Solymar and D. Cooke, *Volume Holography and Volume Gratings*, Academic Press, 315–327 (1981), the disclosure of which is hereby incorporated by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angle travels undeflected through the hologram. (See, e.g., J. E. Ludman et al., "Very thick holographic nonspatial filtering of laser beams," *Optical Engineering*, Vol. 36, No. 6, 1700 (1997), the disclosure of which is hereby incorporated by reference.) A beam steerer is a hologram that deflects light incident at the Bragg angle. An optical coupler is typically a combination of beam deflectors that steer light from a source to a target. These articles, typically referred to as holographic optical elements, are fabricated by imaging a particular optical interference pattern within a recording medium, as discussed previously with respect to data storage. Medium for these holographic optical elements are capable of being formed by the techniques discussed herein for recording media or waveguides.

As mentioned previously, the material principles discussed herein are applicable not only to hologram formation, but also to formation of optical transmission devices such as waveguides. Polymeric optical waveguides are discussed for example in B. L. Booth, "Optical Interconnection Polymers," in *Polymers for Lightwave and Integrated Optics, Technology and Applications*, L. A. Hornak, ed., Marcel Dekker, Inc. (1992); U.S. Pat. No. 5,292,620; and U.S. Pat. No. 5,219,710, the disclosures of which are hereby incorporated by reference. Essentially, the recording material of the invention is irradiated in a desired waveguide pattern to provide refractive index contrast between the waveguide pattern and the surrounding (cladding) material. It is possible for exposure to be performed, for example, by a focused laser light or by use of a mask with a non-focused light source. Generally, a single layer is exposed in this manner to provide the waveguide pattern, and additional layers are added to complete the cladding, thereby completing the waveguide. The process is discussed for example at pages 235–36 of Booth, supra, and cols. 5 and 6 of U.S. Pat. No. 5,292,620. A benefit of the invention is that by using conventional molding techniques, it is possible to mold the matrix/photoimageable system mixture into a variety of shapes prior to matrix cure. For example, the matrix/photoimageable system mixture is able to be molded into ridge waveguides, wherein refractive index patterns are then written into the molded structures. It is thereby possible to easily form structures such as Bragg gratings. This feature of the invention increases the breadth of applications in which such polymeric waveguides would be useful.

The invention will be further clarified by the following examples, which are intended to be exemplary.

EXAMPLES

To fabricate the high-performance recording article, the NCO-terminated prepolymer and polyol must first be reacted to form a matrix in which the acrylate monomer, which remains unreacted, will reside.

As the reaction of the NCO-terminated prepolymer and polyol are a two-component system, the NCO-terminated prepolymer, acrylate monomer, and photoinitiator, are pre-dissolved to form a homogeneous solution. The polyol, tin catalyst, and other additives are premixed. The two mixtures were prepared in vials, mixed, degassed, and then applied to substrates to set up.

For less soluble photoinitiators, however, mixing the isocyanate and initiator with a solvent and then stripping the solvent under vacuum can be implemented to facilitate dissolution. Alternatively, the photoinitiator/isocyanate mix can be heated provided that no other components of the formulations have been added.

A dispensing apparatus and the optical flats could also be used for making quality articles for recording digital data, but it is not necessary for plane wave data as is described in examples below. The inventors merely applied the formula between glass slides and used spacers to adjust thickness.

High performance holographic recording articles are characterized by low shrinkage, high dynamic range, and high sensitivity. Low shrinkage will assure non-degradation of the recorded holograms and total fidelity of the holographic data to be recovered. Low shrinkage in the range of less than 0.2% is desired. The dynamic range of a holographic recording medium is typically characterized by the parameter, M/#, a measure of how many holograms of a given average diffraction efficiency that can be stored in a common volume. The MN# is determined by the sum of the square roots of the diffraction efficiency of each multiplexed hologram. Typical values of MN# are 1.5 or better for a 200 micron thick sample.

The photosensitivity (sensitivity (S) in $cm^2/mJ$) is characterized by the refractive index contrast that is achieved normalized to the timed response of the media The sensitivity can be in the range of $1e^{-9}$ to $1e^{-1}$, preferably $1e^{-6}$ to $1e^{-1}$.

Details of the measurements of the recording-induced shrinkage, MN#/200 $\mu$m, and sensitivity are described in detail in Applied Physics Letters, Volume 73, Number 10, p. 1337–1339, 7 Sep. 1998, which is incorporated herein by reference. Angle-multiplexing a series of plane-wave holograms into the recording medium produces these measurements. The laser used for recording and recovery of the multiplexed holograms was spatially filtered and collimated by a lens to yield a plane-wave source of light. The light was then split into two beams by polarizing beam splitters and half-wave plates and intersected at the sample at an external angle of 44°. The power of each beam was 2 mW and the spot diameter was 4 mm. Each hologram is written with a predetermined exposure time. After recording, the material was allowed to sit in the dark for 10 minutes and then flood cured with a Xenon lamp filtered to transmit wavelengths longer than 420 nm.

Shrinkage, dynamic range (M/#/200 $\mu$m), and sensitivity were measured. The experimental system used to characterize these parameters of the media is described in Applied Physics Letters, Volume 73, Number 10, p. 1337–1339, Sep. 7, 1999 and Optics Letters, Volume 24, Number 7, p. 487, Apr. 1, 1999, which are incorporated herein by reference. In particular, the measurements are as follows.

(a) The shrinkage (occurring primarily in the thickness of the medium) is determined by measuring the Bragg detuning (the shift in the readout angle) of the angle multiplexed holograms. The quantitative relationship between the physical shrinkage of the material and the Bragg detuning is described in detail in the above reference, i.e., Applied Physics Letters, Volume 73, Number 10, p. 1337–1339, 7 Sep. 1998.

(b) M/# is defined to be the dynamic range of the recording material. M/# is defined as the sum of the square roots of the diffraction efficiencies of the multiplexed holograms. The M/# is measured by multiplexing a series of holograms with exposure times set to consume all of the photoactive material within a region (spot size of the overlapping beams) of the media. Because M/# depends on the thickness of the media, the quantities listed in the examples are scaled to 200 $\mu$m thicknesses.

(c) The index of refraction contrast ($\Delta n$) of the media is proportional to the dynamic range and is given by:

$$\Delta n = (M/\#)/(\Pi d) \times \lambda \cos(\theta)$$

wherein $\Pi$ is pi, which stands for summation, d is the media thickness, $\theta$ is the ½ angle within the media for the intersecting beams, and $\lambda$ is the laser wavelength. The value of $\Delta n$ calculated from this equation for the media described in this invention is in the range of $1e^{-7}$ to 1, preferably in the range of $1e^{-6}$ to $1e^{-1}$.

(d) The sensitivity of the holographic recording media is related to the response time of the media as well as the index of refraction contrast ($\Delta n$) that is needed to achieve the determined dynamic range (M/#). The sensitivity (S) is then defined to be:

$$S = \Delta n/(t_{80} \times \text{laser power density at the media})$$

wherein $t_{80}$ is defined as the time needed to use 80% of the dynamic range (M/#) of the media, and the parenthetic term is the writing fluence. The inverse of this writing fluence is a refractive index unadjusted sensitivity.

The above equations allow one to easily calculate a sensitivity number (S) that can be used for comparison purposes for samples of varying thickness or for samples tested on characterization setups having differing angles of intersection, wavelengths, and/or laser power densities (e) The average hologram write time is calculated from the sensitivity using assumptions for the strength of individual holograms in a multiplexed stack and for the laser power densities that are required to achieve maximum storage capacity in a digital setup, i.e., to allow the largest number of digital data-page encoded holograms to be recorded in the media. It is assumed that individual holograms having refractive index contrast of $1.63 \times 10^{-6}$ and a laser power density of 160 $mW/cm^2$ will be required. Taking these assumptions, one can modify the sensitivity equation from (d) above to calculate average write times as follows:

$$t = \Delta n/(S \times \text{laser power density})$$

wherein t is the average write time per hologram, Δn and laser power density are the assumed values just described, and S is as defined in (d) above.

Example 1

The holographic performance of two identical formulations, one with Irgacure® 784 (green sensitized) and t-butyl hydroperoxide, and the other with Irgacure® 819 (blue sensitized), were compared at 532 nm and 405 nm respectively. The formulation and performance characteristics of the green and blue sensitized holographic recording media are shown in Table 2.

TABLE 2

| Component/Parameter | Green-Sensitized Medium | Blue-Sensitized Medium |
|---|---|---|
| Baytec WE-180 Isocyanate | 38.4 Wt % | 38.5 Wt % |
| Glycerol Propoxylate (MW 1000) | 56.1 Wt % | 56.3 Wt % |
| Tribromophenyl Acrylate | 3.5 Wt % | 3.5 Wt % |
| Photoinitiator | 0:8 Wt % (Irgacure ® 784) | 0.8 Wt % (Irgacure ® 819) |
| t-Butyl Hydroperoxide | 0.3 Wt % | None added |
| Thermal Inhibitor | None added | None added |
| Dibutyltin Dilaurate Catalyst | 0.9 Wt % | 0.9 Wt % |
| Shrinkage | 0.1% | 0.1% |
| M/#/200 μm | 2.2 | 2.5 |
| Refractive index contrast Δn | $1.8 \times 10^{-3}$ | $1.57 \times 10^{-3}$ |
| Unadjusted sensitivity (cm$^2$/mJ) | $1.16 \times 10^{-3}$ | $4.48 \times 10^{-3}$ |
| Writing fluence, (mJ/cm$^2$) | 860 | 223 |
| Refractive index contrast adjusted sensitivity (cm$^2$/mJ) | $2.1 \times 10^{-6}$ | $7.1 \times 10^{-6}$ |
| Average Write Time For 1 Hologram | 4.9 ms | 1.4 ms |

Example 2

This example provides a comparison with results for diphenyl (2,4,6-trimethylbenzoyl)phosphine oxide (DTBPO) in Table 3. These samples were made in the same way with the same components (except for the initiator) as the above example, but two different photoinitiator concentrations have been included.

TABLE 3

| Component/Parameter | Green-Sensitized Medium (532 nm) | Blue-Sensitized Medium (407 nm) | Blue-Sensitized Medium (407 nm) |
|---|---|---|---|
| Photoinitiator | 0.8 Wt % (Irgacure ® 784) | 0.8 Wt % DTBPO | 0.4 Wt % DTBPO |
| Shrinkage | 0.1% | 0.1% | 0.13% |
| M/#/200 μm | 1.2 | 1.2 | 1.3 |
| Refractive index contrast Δn | $9.8 \times 10^{-4}$ | $7.54 \times 10^{-4}$ | $8.17 \times 10^{-4}$ |
| Unadjusted sensitivity (cm$^2$/mJ) | $2.86 \times 10^{-3}$ | $2.16 \times 10^{-3}$ | $1.40 \times 10^{-3}$ |
| Writing fluence, (mJ/cm$^2$) | 350 | 462 | 714 |
| Refractive index contrast adjusted sensitivity (cm$^2$/mJ) | $2.8 \times 10^{-6}$ | $1.64 \times 10^{-6}$ | $1.14 \times 10^{-6}$ |
| Average Write Time For 1 Hologram | 3.6 ms | 6.2 ms | 8.9 ms |

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application discloses several numerical range limitations. Persons skilled in the art would recognize that the numerical ranges disclosed inherently support any range within the disclosed numerical ranges even though a precise range limitation is not stated verbatim in the specification because this invention can be practiced throughout the disclosed numerical ranges. A holding to the contrary would "let form triumph over substance" and allow the written description requirement to eviscerate claims that might be narrowed during prosecution simply because the applicants broadly disclose in this application but then might narrow their claims during prosecution. Finally, the entire disclosure of the patents and publications referred in this application are hereby incorporated by reference.

What is claimed is:

1. An optical article comprising a photoactive monomer and an organic photoinitiator having a maximum absorption at a UV wavelength and absorption in the range of 400–490 nm incorporated in a polymer matrix, wherein the organic photoinitiator comprises a phosphine oxide group, wherein the organic photoinitiator is selected from the group consisting of:

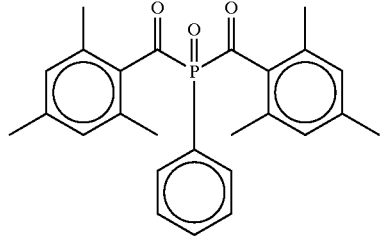

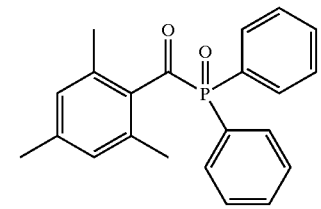

and combinations thereof.

2. The optical article of claim 1, wherein the optical article has a refractive index contrast adjusted sensitivity of greater than $1.14 \times 10^{-6}$ $\Delta n/mJ/cm^2$.

3. The optical article of claim 1, wherein the polymer matrix is in-situ formed by a polymerizing reaction of a material comprising component 1 and component 2, said component 1 comprises a NCO-terminated pre-polymer and said component 2 comprises a polyol.

4. The optical article of claim 1, wherein the polymer matrix is in-situ formed by a polymerizing reaction of a material comprising component 1 and component 2, said component 1 comprises a NCO-terminated pre-polymer selected from the group consisting of diphenylmethane diisocyanate, toluene diisocyanate, hexamethylene diisocyanate, a derivative of hexamethylene diisocyanate, a methylenebiscyclohexylisocyanate and a derivative of methylenebiscyclohexylisocyanate, and said component 2 comprises a polyol of polypropylene oxide.

5. The optical article of claim 1, wherein the photoactive monomer is an acrylate monomer.

6. The optical article of claim 1, wherein the optical article comprises a holographic recording medium.

7. The optical article of claim 1, wherein the optical article has a writing induced shrinkage of less than 0.25 percent.

8. The optical article of claim 1, wherein the photoinitiator is

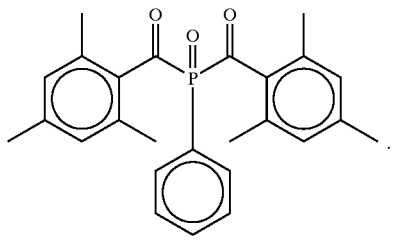

9. The optical article of claim 1, wherein the photoinitiator is

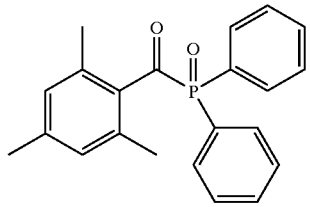

10. A method for holographic recording in an optical article comprising exposing the optical article to:blue light and writing a hologram in the optical article, the optical article comprising a photoactive monomer and an organic photoinitiator having a maximum absorption at a UV wavelength and absorption tails in the range of 400–490 nm incorporated in a polymer matrix, wherein the organic photoinitiator comprises a phosphine oxide group, wherein the organic photoinitiator is selected from the group consisting of:

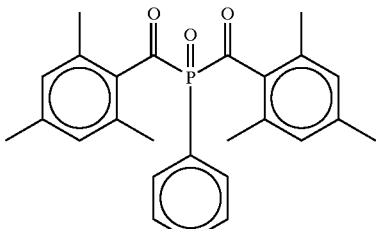

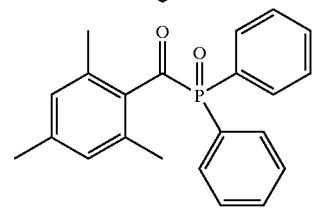

and combinations thereof.

11. The method of claim 10, wherein the optical article has a refractive index contrast adjusted sensitivity of greater than $1.14 \times 10^{-6}$ $\Delta n/mJ/cm^2$.

12. The method of claim 10, wherein the polymer matrix is formed by a polymerizing reaction of a material comprising component 1 and component 2, said component 1 comprises a NCO-terminated pre-polymer and said component 2 comprises a polyol.

13. The method of claim 10, wherein the polymer matrix is formed by a polymerizing reaction of a material comprising component 1 and component 2, said component 1 comprises a NCO-terminated pre-polymer selected from the group consisting of diphenylmethane diisocyanate, toluene diisocyanate, hexamethylene diisocyanate, a derivative of hexamethylene diisocyanate, a methylenebiscyclohexylisocyanate and a derivative of methylenebiscyclohexylisocyanate, and said component 2 comprises a polyol of polypropylene oxide.

14. The method of claim 10, wherein the photoactive monomer is an acrylate monomer.

15. The method of claim 10, wherein the optical article has a writing induced shrinkage of less than 0.25 percent.

16. The method of claim 11, wherein the photoinitiator is

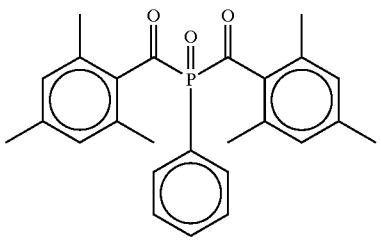

17. The method of claim 10, wherein the photoinitiator is

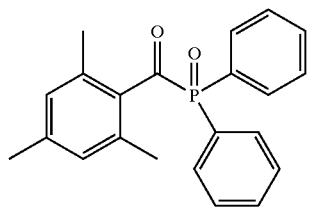

18. A method for manufacturing an optical article comprising polymerizing a material comprising component 1 and component 2 which are reacted to form a polymer matrix and forming the optical article, the optical article comprises a photoactive monomer and an organic photoinitiator having a maximum absorption at a UV wavelength and absorption tails in the range of 400–490 nm incorporated in the polymer matrix, and the organic photoinitiator comprises a phosphine oxide group, wherein the organic photoinitiator is selected from the group consisting of:

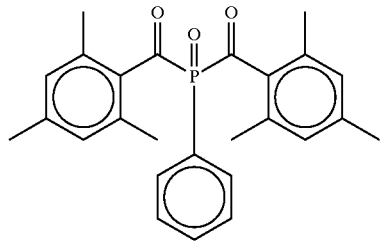

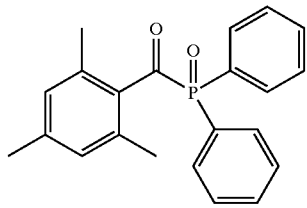

and combinations thereof.

19. The method of claim 18, wherein the optical article has a refractive index contrast adjusted sensitivity of greater than $1.14 \times 10.6^{-6}$ $\Delta n/mJ/cm^2$.

20. The method of claim 18, wherein said component 1 comprises a NCO-terminated pre-polymer and said component 2 comprises a polyol.

21. The method of claim 18, wherein said component 1 comprises a NCO-terminated pre-polymer selected from the group consisting of diphenylmethane diisocyanate, toluene diisocyanate, hexamethylene diisocyanate, a derivative of hexamethylene diisocyanate, a methylenebiscyclohexylisocyanate and a derivative of methylenebiscyclohexylisocyanate, and said component 2 comprises a polyol of polypropylene oxide.

22. The method of claim 18, wherein the photoactive monomer is an acrylate monomer.

23. The method of claim 18, wherein the optical article comprises a holographic recording medium.

24. The method of claim 18, wherein the optical article has a writing induced shrinkage of less than 0.25 percent.

25. The method of claim 18, wherein the photoinitiator is

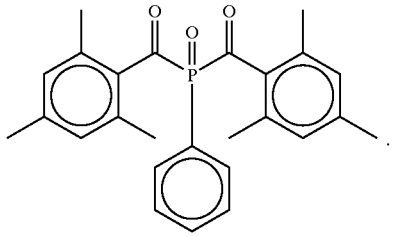

26. The method of claim 18, wherein the photoinitiator is

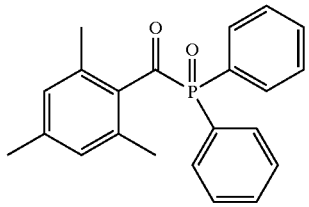

27. An optical article comprising a matrix obtained by (1) mixing (a) a matrix precursor comprising component 1 and component 2, said component 1 comprising an isocyanate-terminated prepolymer and said component 2 comprising a polyol, (b) an organic photoinitiator selected from the group consisting of bis(2,4,6-trimethylbenzoyl)phenyl phosphine oxide and 2,4,6-trimethylbenzoyl-diphenyl phosphine oxide and combinations thereof, and (c) a photoactive monomer, and (2) curing the mixture to polymerize the matrix precursor and form the matrix.

28. A method for manufacturing an optical article comprising (1) mixing (a) a matrix precursor comprising component 1 and component 2, said component 1 comprising an isocyanate-terminated prepolymer and said component 2 comprising a polyol, (b) an organic photoinitiator selected from the group consisting of bis(2,4,6-trimethylbenzoyl) phenyl phosphine oxide and 2,4,6-trimethylbenzoyl-diphenyl phosphine oxide and combinations thereof, and (c) a photoactive monomer, and (2) curing the mixture to polymerize the matrix precursor and form a matrix.

29. A method for holographic recording in an optical article comprising exposing the optical article to blue light and writing a hologram in the optical article, the optical article being obtainable by (1) mixing (a) a matrix precursor comprising component 1 and component 2, said component 1 comprising an isocyanate-terminated pre-polymer and said component 2 comprising a polyol, (b) an organic photoinitiator selected from the group consisting of bis(2,4,6-trimethylbenzoyl)phenyl phosphine oxide and 2,4,6-trimethylbenzoyl-diphenyl phosphine oxide and combinations thereof, and (c) a photoactive monomer, and (2) curing the mixture to polymerize the matrix precursor and form a matrix.

* * * * *